(12) United States Patent
Nagayama et al.

(10) Patent No.: US 10,042,206 B2
(45) Date of Patent: Aug. 7, 2018

(54) DISPLAY SUBSTRATE, DISPLAY PANEL AND DISPLAY DEVICE

(71) Applicant: BOE TECHNOLOGY GROUP CO., LTD., Beijing (CN)

(72) Inventors: Kazuyoshi Nagayama, Beijing (CN); Song Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 76 days.

(21) Appl. No.: 14/905,557

(22) PCT Filed: Aug. 12, 2015

(86) PCT No.: PCT/CN2015/086757
§ 371 (c)(1),
(2) Date: Jan. 15, 2016

(87) PCT Pub. No.: WO2016/123951
PCT Pub. Date: Aug. 11, 2016

(65) Prior Publication Data
US 2016/0370655 A1    Dec. 22, 2016

(30) Foreign Application Priority Data
Feb. 3, 2015    (CN) .......................... 2015 1 0055786

(51) Int. Cl.
*G02F 1/1335* (2006.01)
*H01L 27/32* (2006.01)
(Continued)

(52) U.S. Cl.
CPC ...... *G02F 1/133617* (2013.01); *H01L 27/322* (2013.01); *H01L 51/524* (2013.01);
(Continued)

(58) Field of Classification Search
None
See application file for complete search history.

(56) References Cited

U.S. PATENT DOCUMENTS

2007/0115405 A1* 5/2007 Kazuyoshi ............. G02B 5/201
349/107
2008/0224596 A1    9/2008 Park et al.
(Continued)

FOREIGN PATENT DOCUMENTS

CN    102944943 A    2/2013
CN    103091895 A    5/2013
(Continued)

OTHER PUBLICATIONS

First Chinese Office Action regarding Application No. 201510055786.1 dated Dec. 1, 2016. Translation provided by Dragon Intellectual Property Law Firm.
(Continued)

*Primary Examiner* — Ryan Crockett
(74) *Attorney, Agent, or Firm* — Harness, Dickey & Pierce, P.L.C.

(57) ABSTRACT

The present disclosure provides a display substrate, a display panel and a display device. The display substrate includes a first base substrate and a filter layer arranged on the first base substrate. The filter layer includes a red-light emission unit, a green-light emission unit and a blue-light transmission unit. The red-light emission unit includes a red quantum dot material capable of emitting red light when it is irradiated by blue light, the green-light emission unit includes a green quantum dot material capable of emitting green light when it is irradiated by the blue light, and the blue-light transmission unit is not covered with a quantum dot material and the blue light is transmitted through the blue-light transmission unit.

16 Claims, 3 Drawing Sheets

(51) Int. Cl.
*H01L 51/52* (2006.01)
*G02B 5/20* (2006.01)

(52) U.S. Cl.
CPC .......... *H01L 51/5281* (2013.01); *G02B 5/201* (2013.01); *G02F 2001/133614* (2013.01); *G02F 2201/52* (2013.01); *G02F 2202/36* (2013.01); *G02F 2203/055* (2013.01); *H01L 27/3211* (2013.01); *H01L 51/5284* (2013.01); *H01L 2251/5338* (2013.01); *H01L 2251/5369* (2013.01)

(56) References Cited

U.S. PATENT DOCUMENTS

| | | | |
|---|---|---|---|
| 2009/0039448 | A1 | 2/2009 | Chuang et al. |
| 2011/0216271 | A1* | 9/2011 | Suzuki ................ G02F 1/13362 349/71 |
| 2014/0022819 | A1* | 1/2014 | Oh ........................ G02B 6/005 362/607 |
| 2014/0183478 | A1* | 7/2014 | Lee ........................ H01L 51/56 257/40 |
| 2014/0204319 | A1* | 7/2014 | Cai ................... G02F 1/133514 349/106 |
| 2014/0232956 | A1* | 8/2014 | Kwon ............... G02F 1/133305 349/12 |
| 2015/0048348 | A1* | 2/2015 | Huang ................. H01L 27/322 257/40 |
| 2015/0185381 | A1* | 7/2015 | Wu ........................ G02B 5/201 349/106 |
| 2015/0219965 | A1* | 8/2015 | Dong ................ G02F 1/133617 349/69 |
| 2015/0301408 | A1* | 10/2015 | Li ..................... G02F 1/133621 362/84 |
| 2015/0331278 | A1* | 11/2015 | Araki ................ G02F 1/133617 349/61 |
| 2016/0195766 | A1* | 7/2016 | Kim .................. G02F 1/133533 349/97 |
| 2016/0357068 | A1* | 12/2016 | Yang ................ G02F 1/133504 |

FOREIGN PATENT DOCUMENTS

| | | | |
|---|---|---|---|
| CN | 103236435 | A | 8/2013 |
| CN | 203465442 | U | 3/2014 |
| CN | 104280935 | * | 1/2015 |
| CN | 104280935 | A | 1/2015 |
| CN | 104536198 | A | 4/2015 |
| JP | 2013015812 | A | 1/2013 |

OTHER PUBLICATIONS

Written Opinion and Search Report regarding International Application No. PCT/CN2015/086757. Translation provided by Dragon Intellectual Property Law Firm.

Second Office Action regarding Chinese Application No. 201510055786.1, dated Jun. 22, 2017. Translation provided by Dragon Intellectual Property Law Firm.

* cited by examiner

DISPLAY SUBSTRATE, DISPLAY PANEL AND DISPLAY DEVICE

CROSS-REFERENCE TO RELATED APPLICATION

The present is the U.S. national phase of PCT Application No. PCT/CN 2015/086757 filed on Aug. 12, 2015, which application claims a priority of the Chinese patent application No. 201510055786.1 filed on Feb. 3, 2015, the disclosure of each of which are incorporated herein by reference in their entirety.

TECHNICAL FIELD

The present disclosure relates to the field of display technology, in particular to a display substrate, a display panel and a display device.

BACKGROUND

Referring to FIG. 1, which is a schematic view showing an existing white organic light-emitting diode (WOLED) display panel, the WOLED display panel includes a first substrate 10 and a second substrate 20 arranged opposite to each other. The first substrate 10 includes a first base substrate 11 and a color filter layer 12 arranged on the first base substrate 11 and including a red light filter R, a green light filter G and a blue light filter B. The second substrate 20 includes a second base substrate 21 and a white light-emitting diode 22 arranged on the second base substrate 21.

Researches show that, for an existing color display mode using the WOLED in combination with a common color filter, its light utilization rate is low and the resultant display device is of a narrow gamut.

SUMMARY

An object of the present disclosure is to provide a display substrate, a display panel and a display device, so as to improve the light utilization rate of the display device during the color display and improve the gamut thereof.

In one aspect, the present disclosure provides in some embodiments a display substrate, including a first base substrate and a filter layer arranged on the first base substrate. The filter layer includes a red-light emission unit, a green-light emission unit and a blue-light transmission unit. The red-light emission unit includes a red quantum dot material capable of emitting red light when it is irradiated by blue light, the green-light emission unit includes a green quantum dot material capable of emitting green light when it is irradiated by the blue light, and the blue-light transmission unit is not covered with a quantum dot material and the blue light is transmitted through the blue-light transmission unit.

Alternatively, the red-light emission unit further includes a first blue-light filter layer arranged between the red quantum dot material and the first base substrate and configured to filter blue light transmitted through the red quantum dot material; and/or the green-light emission unit includes a second blue-light filter layer arranged between the green quantum dot material and the first base substrate and configured to filter blue light transmitted through the green quantum dot material.

Alternatively, the display substrate further includes a black matrix arranged between two adjacent light-emitting units on the filter layer and having a height greater than or equal to its adjacent light-emitting unit, and the light-emitting units include the red-light emission unit, the green-light emission unit and the blue-light transmission unit.

Alternatively, the display substrate is a flexible display substrate, and a region where the blue-light transmission unit is located forms a flexible region.

In another aspect, the present disclosure provides in some embodiments a display panel including the above-mentioned display substrate.

Alternatively, the display panel is a thin film transistor liquid crystal display (TFT-LCD) panel, and it further includes: a further substrate arranged opposite to the display substrate, and including a second base substrate and TFTs arranged on the second base substrate; and a liquid crystal layer arranged between the display substrate and the further substrate.

Alternatively, the display panel is an OLED display panel, and it further includes a further substrate arranged opposite to the display substrate, and including a second substrate and a blue OLED arranged on the second base substrate and configured to emit blue light toward a filter layer.

Alternatively, when the display panel is the OLED display panel, it is a flexible display panel, and a region where a blue-light transmission unit is located forms a flexible region.

In yet another aspect, the present disclosure provides in some embodiments a display device including the above-mentioned display panel.

In still yet another aspect, the present disclosure provides in some embodiments a display device including a TFT-LCD display panel, and a blue backlight module arranged at a side of a further substrate away from a display substrate and configured to emit blue light toward a filter layer.

According to the embodiments of the present disclosure, at a red-light region and a green-light region of a pixel unit, an existing red light filter and an existing green light filter are replaced with the red quantum dot material and the green quantum dot material respectively, and the red quantum dot material and the green quantum dot material are excited by the blue light so as to emit the red light and the green light. In addition, an existing blue light filter is removed, a blue-light region is not covered with any quantum dot material, and the blue light may be transmitted through the blue-light region. The quantum dot materials at the red-light region and the green-light region each have a light-emitting characteristic, and the blue-light region is not covered with any quantum dot material and the blue light may be directly transmitted therethrough, so it is able to remarkably improve the light utilization rate and acquire the light with better color purity, thereby to enlarge the gamut an reduce the power consumption during the color display.

DETAILED DESCRIPTION

The present disclosure will be described hereinafter in conjunction with the drawings and embodiments. The following embodiments are for illustrative purposes only, but shall not be used to limit the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
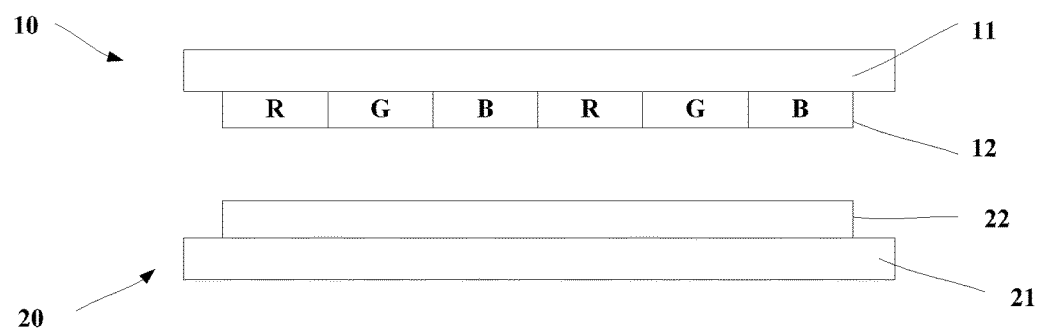
FIG. 1 is a schematic view showing an existing WOLED display panel.
Figure 2:
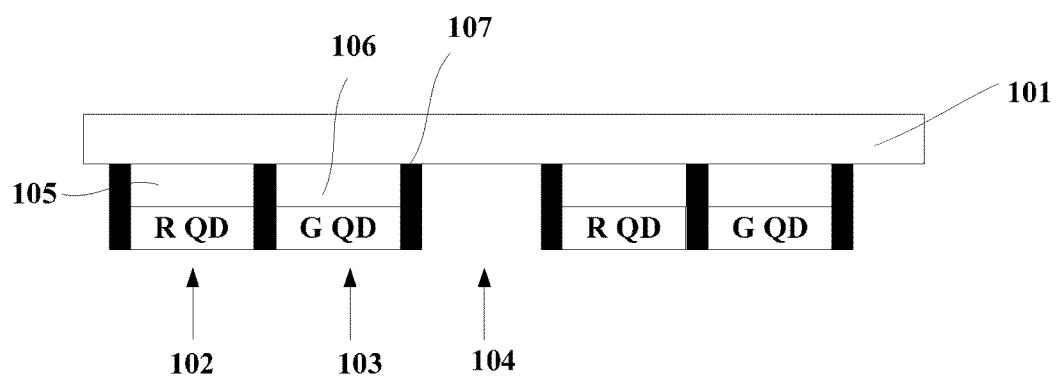
FIG. 2 is a schematic view showing a display substrate according to at least one embodiment of the present disclosure.

Referring to FIG. 2, which is a schematic view showing a display substrate according to one embodiment of the present disclosure, the display substrate includes a first base substrate 101 and a filter layer arranged on the first base substrate 101. The filter layer includes a red-light emission unit 102, a green-light emission unit 103 and a blue-light transmission unit 104. The red-light emission unit 102 includes a red quantum dot (R QD) material capable of emitting red light when it is irradiated by blue light, the green-light emission unit 103 includes a green quantum dot (G QD) material capable of emitting green light when it is irradiated by the blue light, and the blue-light transmission unit 104 is not covered with a quantum dot material and the blue light is transmitted through the blue-light transmission unit 104.

According to the display substrate in the embodiments of the present disclosure, at a red-light region and a green-light region of a pixel unit, an existing red light filter and an existing green light filter are replaced with the red quantum dot material and the green quantum dot material respectively, and the red quantum dot material and the green quantum dot material are excited by the blue light so as to emit the red light and the green light. In addition, an existing blue light filter is removed, a blue-light region is not covered with any quantum dot material, and the blue light may be transmitted through the blue-light region. The quantum dot materials at the red-light region and the green-light region each have a light-emitting characteristic, and the blue-light region is not covered with any quantum dot material and the blue light may be directly transmitted therethrough, so it is able to remarkably improve a light utilization rate and acquire the light with better color purity, thereby to enlarge the gamut and reduce the power consumption during the color display.

Figure 3:
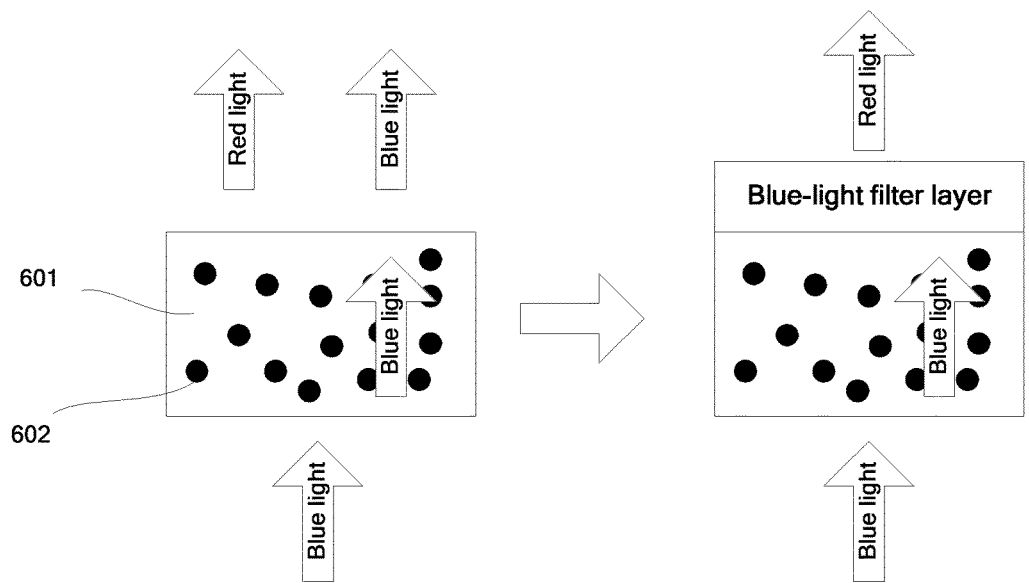
FIG. 3 is a schematic view showing a working principle of a blue-light filter layer according to at least one embodiment of the present disclosure.

Referring to FIG. 3, in some embodiments of the present disclosure, the quantum dot material consists of a base material 601 and quantum dots 602 distributed within the base material 601. The base material may be an epoxy resin or monomer.

The red quantum dot material may emit the red light when it is irradiated by the blue light. However, the blue light entering the red quantum dot material may not be fully utilized, and a part of the blue light may be transmitted therethrough. At this time, the purity of the light emitted by the red quantum dot material may be adversely affected. In this regard, alternatively, a first blue light filter layer 105 is arranged between the red quantum dot material and the first base substrate 101, so as to filter the blue light transmitted through the red quantum dot material.

Identically, the blue light entering the green quantum dot material may not be fully utilized, and a part of the blue light may be transmitted therethrough. In this regard, alternatively, a second blue light filter layer 106 is arranged between the red quantum dot material and the first base substrate 101, so as to filter the blue light transmitted through the green quantum dot material.

FIG. 2 shows working principles of the first blue light filter layer 105 and the second blue light filter layer 106.

In order to prevent the mutual effect caused by the light from adjacent light-emitting units (i.e., the red-light emission unit 102, the green-light emission unit 103 and the blue-light transmission unit 104) and further improve the gamut during the color display, the display substrate in the embodiments of the present disclosure may further include a black matrix 107 arranged between the two adjacent light-emitting units on the filter layer, and the black matrix 107 has a height greater than or equal to its adjacent light-emitting units.

Figure 4:
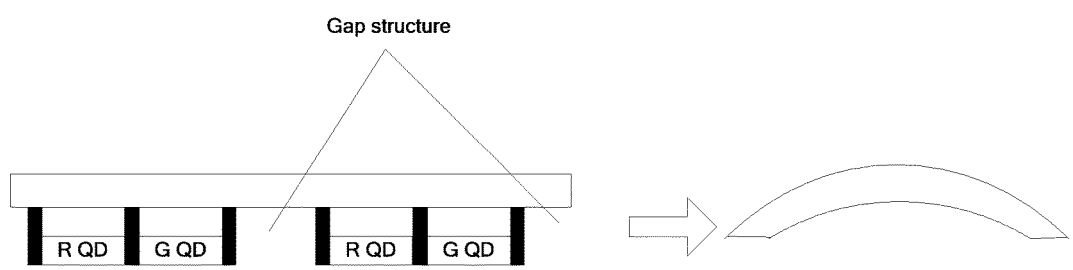
FIG. 4 is a schematic view showing a bending procedure of a flexible display substrate according to at least one embodiment of the present disclosure.

Referring to FIG. 4, in the embodiments of the present disclosure, the blue-light transmission unit is not covered with the quantum dot material, i.e., there is a gap structure at a region where the blue-light transmission unit is located, so the region where the blue-light transmission unit is located forms a flexible region. When the display substrate in the embodiments of the present disclosure is a flexible display substrate, it may be bent more readily as compared with an existing display substrate including a flat color filter layer, so the durability of the display substrate may be improved.

When the display substrate in the embodiments of the present disclosure is a flexible display substrate, the base substrate of the display substrate is usually made of a soft material, e.g., resin.

Of course, the display substrate in the embodiments of the present disclosure may also be a rigid display substrate, i.e., its base substrate is made of a rigid material such as glass.

The present disclosure further provides in some embodiments a display panel including the above-mentioned display substrate.

The display panel may be a TFT-LCD panel, and at this time, it may further include: a further substrate arranged opposite to the display substrate, and including a second base substrate and TFTs arranged on the second base substrate; and a liquid crystal layer arranged between the display substrate and the further substrate.

The display panel may be an OLED display panel, and at this time, it may further include a further substrate arranged opposite to the display substrate, and including a second base substrate and blue OLEDs arranged on the second base substrate and configured to emit blue light toward the filter layer.

When the display panel is an OLED display panel, it may be a flexible one, and at this time, a region where the blue-light transmission unit is located forms a flexible region.

The present disclosure further provides in some embodiments a display device including the above-mentioned display panel.

Figure 5:
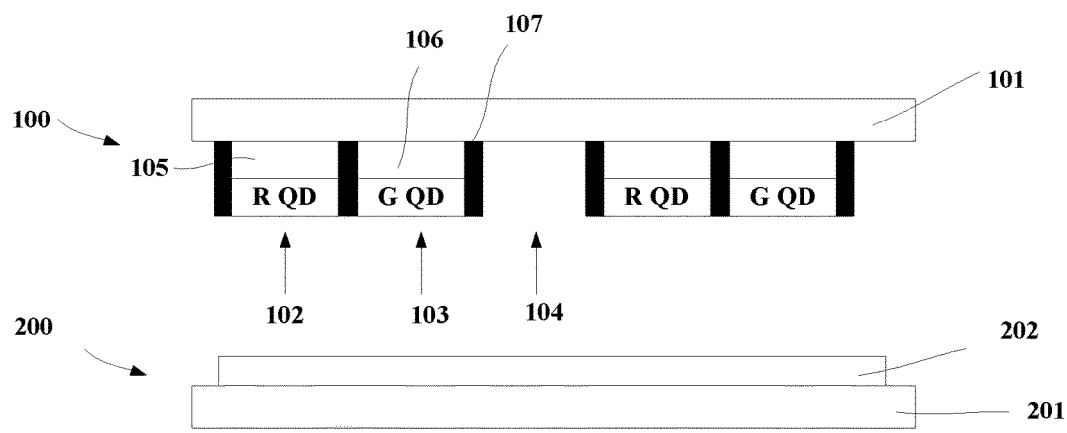
FIG. 5 is a schematic view showing an OLED display panel according to at least one embodiment of the present disclosure.

Referring to FIG. 5, the display device in the embodiments of the present disclosure may be an OLED display device, and at this time, it may include a display substrate 100 and a further substrate 200 arranged opposite to each other.

The display substrate 100 includes a first base substrate 101 and a filter layer arranged on the first base substrate 101. The filter layer includes the red-light emission unit 102, the green-light emission unit 103 and the blue-light transmission unit 104. The red-light emission unit 102 includes a red quantum dot material (R QD) capable of emitting red light when it is irradiated by blue light, the green-light emission unit 103 includes a green quantum dot (G QD) material capable of emitting green light when it is irradiated by the blue light, and the blue-light transmission unit 104 is not covered with a quantum dot material and the blue light is transmitted through the blue-light transmission unit 104.

The further substrate 200 includes a second base substrate 201 and a blue OLED 202 arranged on the second base substrate 201 and capable of emitting the blue light.

Usually, the blue OLED 202 includes an anode, a blue organic light-emitting layer and a cathode.

The OLED display panel may be a flexible one, and at this time, the first base substrate 101 on the display substrate 100 and the second base substrate 201 on the further substrate 200 may each be made of a soft material.

Figure 6:
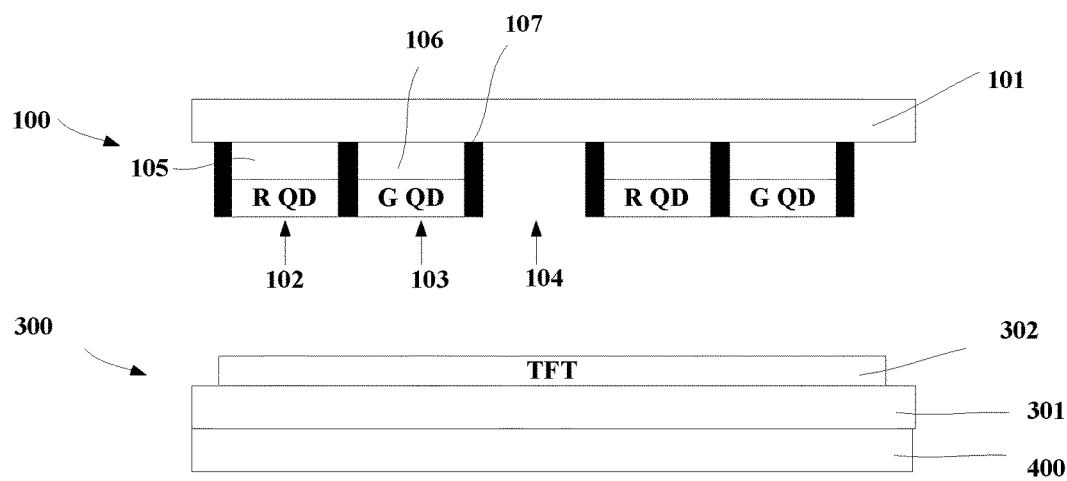
FIG. 6 is a schematic view showing a TFT-LCD display panel according to at least one embodiment of the present disclosure.

Referring to FIG. 6, the display device in the embodiments of the present disclosure may be a TFT-LCD display device, and at this time, it includes a display substrate 100 and a further substrate 300 arranged opposite to each other, a liquid crystal layer (not shown) arranged between the display substrate 100 and the further substrate 300, and a blue backlight module 400.

The display substrate 100 includes a first base substrate 101 and a filter layer arranged on the first base substrate 101. The filter layer includes the red-light emission unit 102, the green-light emission unit 103 and the blue-light transmission unit 104. The red-light emission unit 102 includes a red quantum dot material (R QD) capable of emitting red light when it is irradiated by blue light, the green-light emission unit 103 includes a green quantum dot (G QD) material capable of emitting green light when it is irradiated by the blue light, and the blue-light transmission unit 104 is not covered with a quantum dot material and the blue light is transmitted through the blue-light transmission unit 104.

The further substrate 300 includes a second base substrate 301 and a TFT 302 arranged on the second base substrate 301.

The blue backlight module 400 is arranged at a side of the further substrate 300 away from the display substrate 100, and it is used to emit blue light.

The above are the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A display substrate, comprising a first base substrate and a filter layer arranged on the first base substrate, wherein the filter layer comprises a plurality of light-emitting units including a red-light emission unit, a green-light emission unit, and a blue-light emission unit, the red-light emission unit comprises a red quantum dot material capable of emitting red light when it is irradiated by the blue light, the green-light emission unit comprises a green quantum dot material capable of emitting green light when it is irradiated by the blue light, and the blue-light emission unit is of a gap structure and defines a flexible region of the filter layer, wherein a black matrix is arranged between two adjacent light-emitting units on the filter layer, and has a height greater than each of the adjacent light-emitting units.

2. The display substrate according to claim 1, wherein the red-light emission unit further comprises a first blue-light filter layer arranged between the red quantum dot material and the first base substrate and configured to filter blue light transmitted through the red quantum dot material.

3. The display substrate according to claim 2, wherein the red or green quantum dot material consists of a base material and quantum dots distributed within the base material, and the base material is resin or monomer.

4. The display substrate according to claim 2, wherein the display substrate is a flexible display substrate.

5. The display substrate according to claim 1, wherein the red or green quantum dot material consists of a base material and quantum dots distributed within the base material, and the base material is resin or monomer.

6. The display substrate according to claim 1, wherein the display substrate is a flexible display substrate.

7. A display panel comprising the display substrate according to claim 1.

8. The display panel according to claim 7, wherein the display panel is a thin film transistor-liquid crystal display (TFT-LCD) panel, and it further comprises:
   a further substrate arranged opposite to the display substrate, and comprising a second base substrate and TFTs arranged on the second base substrate; and
   a liquid crystal layer arranged between the display substrate and the further substrate.

9. A display device comprising the display panel according to claim 8, and a blue backlight module arranged at a side of the further substrate away from the display substrate and configured to emit blue light toward the filter layer.

10. The display panel according to claim 7, wherein the display panel is an organic light-emitting diode (OLED) display panel, and it further comprises:
   a further substrate arranged opposite to the display substrate, and comprising a second substrate and a blue OLED arranged on the second substrate and configured to emit blue light toward a filter layer.

11. The display panel according to claim 10, wherein the blue OLED comprises an anode, a blue organic light-emitting layer and a cathode.

12. The display panel according to claim 10, wherein the display panel is a flexible display panel.

13. A display device comprising the display panel according to claim 7.

14. A display device comprising the display panel according to claim 7, a further substrate arranged opposite to a display substrate, and a blue backlight module arranged at a side of the further substrate away from the display substrate and configured to emit blue light toward a filter layer.

15. The display substrate according to claim 1, wherein the green-light emission unit comprises a second blue-light filter layer arranged between the green quantum dot material and the first base substrate and configured to filter blue light transmitted through the green quantum dot material.

16. The display substrate according to claim 15, wherein the red or green quantum dot material consists of a base material and quantum dots distributed within the base material, and the base material is resin or monomer.

* * * * *